United States Patent [19]
van de Ven et al.

[11] Patent Number: 5,238,499
[45] Date of Patent: Aug. 24, 1993

[54] GAS-BASED SUBSTRATE PROTECTION DURING PROCESSING

[75] Inventors: Everhardus P. van de Ven, Cupertino; Eliot K. Broadbent; Jeffrey C. Benzing, both of San Jose; Barry L. Chin, Sunnyvale; Christopher W. Burkhart, San Jose, all of Calif.

[73] Assignee: Novellus Systems, Inc., San Jose, Calif.

[21] Appl. No.: 678,579

[22] Filed: Mar. 25, 1991

Related U.S. Application Data

[63] Continuation-in-part of Ser. No. 554,225, Jul. 16, 1990.

[51] Int. Cl.⁵ .................................................. C23C 14/00
[52] U.S. Cl. ................................... 118/724; 118/728; 118/732; 156/345; 29/25.01; 414/222; 204/298.11
[58] Field of Search ................ 156/345; 118/715, 724, 118/728, 732; 204/298.07, 298.11, 298.33; 29/25.01; 414/217, 222, 225

[56] References Cited

U.S. PATENT DOCUMENTS

| | | | |
|---|---|---|---|
| 4,261,762 | 4/1981 | King | 148/1.5 |
| 4,446,872 | 8/1984 | Einbinder | 204/192 |
| 4,457,359 | 7/1984 | Holden | 165/80 C |
| 4,508,161 | 4/1985 | Holden | 165/1 |
| 4,512,391 | 4/1985 | Harra | 165/48 R |
| 4,523,985 | 6/1985 | Dimock | 204/298 |
| 4,527,620 | 7/1985 | Pedersen et al. | 165/800 |
| 4,535,834 | 8/1985 | Turner | 165/800 |
| 4,567,938 | 2/1986 | Turner | 165/80 R |
| 4,575,408 | 3/1986 | Bok | 204/192 E |
| 4,603,466 | 8/1986 | Morley | 29/569 R |

(List continued on next page.)

FOREIGN PATENT DOCUMENTS

| | | |
|---|---|---|
| 0291181A2 | 4/1988 | European Pat. Off. . |
| 3533386A1 | 4/1988 | Fed. Rep. of Germany . |
| 2559953 | 2/1985 | France . |
| 57-85235 | 5/1982 | Japan . |
| 59-3945 | 10/1984 | Japan . |
| 1178122 | 7/1989 | Japan . |

OTHER PUBLICATIONS

VLSI Research Inc., "Integrated Processing Systems," Nov. 1990, p. 12.
Benveniste, "Wafer Cooling in High Current Ion Im- (List continued on next page.)

Primary Examiner—Olik Chaudhuri
Assistant Examiner—Ken Horton
Attorney, Agent, or Firm—Skjerven, Morrill, MacPherson, Franklin & Friel

[57] ABSTRACT

A suitable inert gas such as argon or a mixture of inert and reactive gases such as argon and hydrogen is introduced onto the backside of wafers being processed in a CVD reactor during the deposition of tungsten or other metals, metal nitrides and silicides, to avoid deposition of material on the backside of the wafers being processed. Each process station includes a gas dispersion head disposed over a platen. A vacuum chuck including a number of radial and circular vacuum grooves in the top surface of the platen is provided for holding the wafer in place. A platen heater is provided under the platen. Backside gas is heated in and about the bottom of the platen, and introduced through a circular groove in the peripheral region outside of the outermost vacuum groove of the vacuum chuck. Backside gas pressure is maintained in this peripheral region at a level greater than the CVD chamber pressure. In this manner, backside gas vents from beneath the edge of the wafer on the platen and prevents the process gas from contacting the wafer backside. If the process gas is also to be prevented from contacting the periphery of the wafer frontside, a shroud is urged against the platen to direct the backside gas into a cavity formed between the shroud and the platen. This cavity contains the wafer frontside periphery, so that backside gas venting from between the shroud and the wafer frontside periphery excludes the process gas.

23 Claims, 13 Drawing Sheets

U.S. PATENT DOCUMENTS

| | | | |
|---|---|---|---|
| 4,682,566 | 7/1987 | Aitken | 118/724 |
| 4,687,682 | 8/1987 | Koze | 437/238 |
| 4,709,655 | 12/1987 | Van Mastrigt | 118/719 |
| 4,738,748 | 4/1988 | Kisa | 156/643 |
| 4,743,570 | 5/1988 | Lamont, Jr. | 437/248 |
| 4,767,641 | 8/1988 | Kiever et al. | 427/38 |
| 4,817,558 | 4/1989 | Itoh | 118/725 |
| 4,857,142 | 8/1989 | Syverson | 156/646 |
| 4,859,304 | 8/1989 | Catney et al. | 204/298 |
| 4,911,103 | 3/1990 | Davis et al. | 118/725 |
| 4,960,488 | 10/1990 | Law et al. | 156/643 |
| 4,990,374 | 2/1991 | Keeley et al. | 427/225.1 |
| 5,033,538 | 7/1991 | Wagner et al. | 165/80.1 |
| 5,037,262 | 8/1991 | Moll et al. | 156/345 |

OTHER PUBLICATIONS planter," Nuclear Instruments and Methods in Physics Research B21, North-Holland, Amsterdam, 1987, pp. 366-371.

Bogie-Rohwer et al., "Wall Profile Control in a Triode Etcher," Solid State Technology, Apr. 1985, pp. 251-255.

Douglas-Hamilton et al., "End Station Design and Wafer Quality Control For A High Current Oxygen Implantation," Nuclear Instruments and Methods in Physics Research B21, North-Holland, Amsterdam, 1987, pp. 324-327.

Durzinko et al., "Studies of Anhydrous HF Preoxidation Treatment of Silicon Surfaces," Abstract No. 257 (Date Unknown).

Egerton et al., "Positive Wafer Temperature Control to Increase Dry Etch Throughout and Yield," Solid State Technology, Aug. 1982, pp. 84-87.

Evans, "A Generalized Mathematical Model For Wafer Cooling With Gas," Nuclear Instruments and Methods in Physics Research B21, North-Holland, Amsterdam, 1987, pp. 385-390.

Hammer, "Cooling Ion Implantation Target," IBM Technical Disclosure Bulletin, vol. 19, No. 6, Nov. 1976, pp. 2270-2271.

Hoffman et al., "Individual Wafer Metallization Utilizing Load-Locked, Close-Coupled Conical Magnetron Sputtering," Solid State Technology, Feb. 1981, pp. 105-111 and 120.

Hussla et al., "In Situ Silicon-Wafer Temperature Measurements During RF Argon-Ion Plasma Etching via Fluoroptic Thermometry," J. Phys. D: Appl. Physc. 20, 1987, pp. 889-896.

Kawai et al., "PR-80 High Current Ion Implantation Machine," Nuclear Instruments and Methods in Physics Research B21, North-Holland, Amsterdam, 1987, pp. 239-244.

King et al., "Experiments on Gas Cooling of Wafers," Nuclear Instruments and Methods 189, North-Holland Publishing Company, 1981, pp. 169-173.

Komatsu et al., "A High Throughput End Station of a High Current Ion Implantation," Nuclear Instruments and Methods in Physics Research B21, North-Holland, Amsterdam, 1987, pp. 317-320.

Mack, "Wafer Cooling in Ion Implantation," In Ion Implantation: Equipment and Techniques, H. Ryssel and H. Glawischnig, eds., Springer-Verlag, Berlin, 1983, pp. 221-232.

Mathod, "Design Consideration For A High Pressure, High Etch Rate Single Wafer Reactor," The Electrochemical Society, Proceedings of the Sixth Symposium on Plasma Processing, vol. 87-6, 1987, pp. 134-138.

Mears, "New Method of Solid State Wafer Cooling in the Extron 1000 High Current Ion Implantation System," Nuclear Instruments and Methods in Physics Research B37/38, North-Holland, Amsterdam, 1989, pp. 460-463.

Nakamura et al., "The Effect of Wafer Temperature on Reactive Ion Etching," The Electro-Chemical Society, Proceedings of the Symposium on Dry Process, vol. 88-7, 1988, pp. 78-85.

Ryding, "Target Chambers For Ion Implantation Using Mechanical Scanning," Nuclear Instruments and Methods 189, North-Holland, Publishing Company, 1981, pp. 239-251.

Ryssel et al., "Ion Implantation," John Wiley & Sons, Chichester, 1986, pp. 152-160.

Saitoh, et al., "Impurity Gettering of Polycrystalline Solar Cells Fabricated from Refined Metallurgical--Grade Silicon," IEEE Transactions on Electron Devices, vol. Ed-27, No. 4, Apr. 1980, pp. 671-677.

Scaife, "The Veeco 4840 Automatic Implant System," Nuclear Instruments and Methods in Physics Research B21, North-Holland, Amsterdam, 1987, pp. 258-263.

Steen, et al., "The Precision Implant 9000, A New Concept In Ion Implantation Systems," Nuclear Instruments and Methods in Physics Research B21, North-Holland, Amsterdam, 1987, pp. 328-333.

Syverson et al., "Contamination Aspects of Anhydrous HF Gas Processing," Solid State Technology, Oct. 1988, pp. 101-104.

Taylor et al., "200 nm End Station For Ion Beam Implanters," Nuclear Instruments and Methods in Physics Research B21, North-Holland, Amsterdam, 1987, pp. 224-228.

Turner et al., "Advances in Cassette-to-Cassette Sputtercoating Systems," Solid State Technology, Jul. 1983, pp. 115-123.

Wauk, "New Ion Implantation System With Advanced Process Capabilities," Nuclear Instruments and Methods in Physics Research B21, North-Holland, Amsterdam, 1987, pp. 280-284.

GAS-BASED SUBSTRATE PROTECTION DURING PROCESSING

CROSS-REFERENCE TO RELATED APPLICATION

This application is a continuation-in-part of copending and commonly assigned application Ser. No. 07/554,225, filed Jul. 16, 1990.

BACKGROUND OF THE INVENTION

1. Field of the Invention

This invention relates to semiconductor processing, and more particularly to the protection of certain portions of wafers during semiconductor processing operations.

2. Description of Related Art

Chemical vapor deposition ("CVD") is a gas reaction process commonly used in the semiconductor industry to form thin layers of material known as films over an integrated circuit substrate. The CVD process is based on the thermal, plasma, or thermal and plasma decomposition and reaction of selected gases. The most widely used CVD films are silicon dioxide, silicon nitride, and polysilicon, although a wide variety of CVD films suitable for insulators and dielectrics, semiconductors, conductors, superconductors, and magnetics are well known.

Particulate contamination of CVD films must be avoided. A particularly troublesome source of particulates in the chemical vapor deposition of metals and other conductors such as tungsten, tungsten silicide, and titanium nitride, is the film that forms on the backside of the wafer under certain conditions. For example, if the wafer backside is unprotected or inadequately protected during deposition, a partial coating of the CVD material forms on the wafer backside. This partial coating tends to peel and flake easily for some types of materials, introducing particulates into the chamber during deposition and subsequent handling steps.

Many approaches have been developed for addressing the problem of material deposition on the wafer backside In one approach, the material is permitted to form on the backside, but then is removed immediately following the deposition step using an in-situ plasma etch. This approach entails additional process steps and requires additional equipment capabilities, and also affects the flatness of the wafer. In another approach, the wafer is clamped onto a substrate holder in an attempt to seal and isolate the backside region from the CVD gas. An adequate seal tends to be difficult to achieve in practice, and the mechanical motion between the clamp and the wafer itself causes particulates. Yet another approach is disclosed in U.S. Pat. No. 4,817,558, issued Apr. 4, 1989 to Itoh. A substrate support member having the form of a cylinder is provided with a flat bearing surface on which the wafer rests. Three pins protrude from the peripheral edge portion of the bearing surface. The sidewalls of the shield are insulated from the reactive gases by a cover, which is further provided with a lifted and bent region that surrounds the substrate at the level of the substrate. The lifted and bent region is said to trap the reactive gas on the lateral face of the wafer, thereby preventing a film from being deposited on the wafer backside.

SUMMARY OF THE INVENTION

Undesirable deposition of materials on the wafer backside, edge, and frontside periphery is diminished in the present invention, which in one embodiment includes a pedestal base, a platen mounted on the pedestal base and having a vacuum groove formed in an interior region of its upper surface and a gas groove formed in a peripheral region of its upper surface, a vacuum line integral with the vacuum groove, and a gas line integral with the gas groove. A shield is provided that has a first surface region enclosed by a second surface region. The second surface region is adapted to contact a continuous portion of the platen peripheral region, while the first surface region is adapted to define a cavity in conjunction with a portion of the platen peripheral region. The cavity is adapted to enclose the backside peripheral region, the edge, and a frontside peripheral region of a substrate mounted on said platen. A means for urging the shield against the platen is provided.

In another embodiment of the present embodiment, a platen has a substrate retainer that is ineffective for sealing a periphery of the backside of a substrate against a peripheral surface region of the platen. A gas disperser is disposed in the platen peripheral surface region for introducing a backside gas over the platen peripheral surface region. A shield is provided that has an enclosing contact bottom portion for contacting an enclosing contact portion of the platen peripheral surface region. The shield contact bottom portion encloses a relieved bottom portion, the width of which corresponds to a substrate frontside periphery, and the depth of which corresponds to the substrate thickness. A positioner is provided for selectively lowering the shield into engagement with the platen along the respective contact portions.

In another embodiment of the present invention, a substrate is restrained as a process gas is introduced into the process chamber and a backside gas is introduced to the periphery of the substrate backside. A positive pressure differential is maintained from the periphery of the substrate backside to the process chamber. The backside gas is directed through a cavity adapted to contain the periphery of the substrate backside, the edge of the substrate, and the periphery of the substrate frontside. A positive pressure differential also is maintained from within the cavity to the process chamber

BRIEF DESCRIPTION OF THE DRAWINGS

In the drawings, in which like reference numerals refer to like parts.

DESCRIPTION OF THE PREFERRED EMBODIMENT

Figure 2:
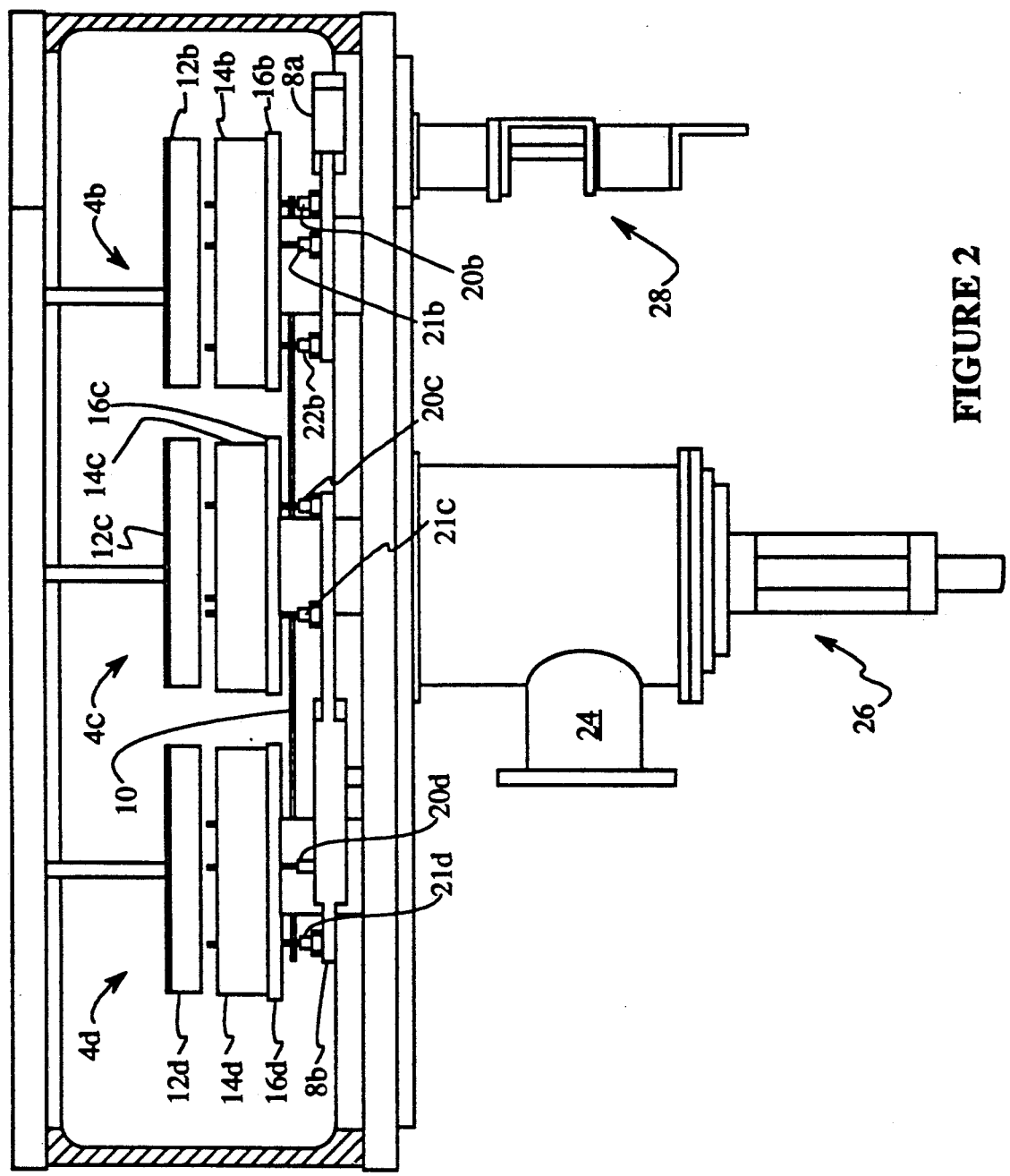
FIG. 2 is a cut away plan view of the process chamber of FIG. 1, as viewed from a side.

An illustrative reaction chamber of a high pressure chemical vapor deposition ("CVD") apparatus is shown from a top view in FIG. i, and from a side view in FIG. 2. The process chamber 2 communicates with a load lock chamber 1, from which wafers to be processed are introduced into the process chamber 2, and into which processed wafers are received from the process chamber 2. Within process chamber 2 are five wafer process stations 4a-4e and a wafer load/unload station 5 Chamber gases are exhausted through vent ports 6a-6f. The system for moving wafers from station 8c to station in the chamber 2 includes pin lift platforms 8a-8c and wafer transport mechanism 10. Also shown in FIG. 2 are a vacuum exhaust port 24, a spindle lift/rotation mechanism 26, and a pin lift mechanism 28, the design of which are well known in the art.

Wafer process stations 4b, 4c and 4d are visible in more detail in the side view of FIG. 2. Process station 4c, for example, includes a dispersion head 12c for introducing a process gas or gas mixture over a wafer to be processed; a platen 14c for supporting the wafer to be processed; a pedestal base 16c, which includes a heater for heating platen 14c and indirectly supplying heat to the wafer to be processed; and pin lift platform 8b, which is associated with pins 20c, 21c and 22c (hidden) for lifting and lowering the wafer to be processed in coordination with activation of the wafer transport mechanism 10. Similarly, process station 4b includes gas dispersion head 12b, platen 14b, pedestal base 16b, and pin lift platform 8a in association with pins 20b, 21b and 22b. Similarly, process station 4d includes gas dispersion head 12d, platen 14d, pedestal base 16d, and pin lift platform 8b in association with pins 20d, 21d and 22d (hidden).

Figure 3:
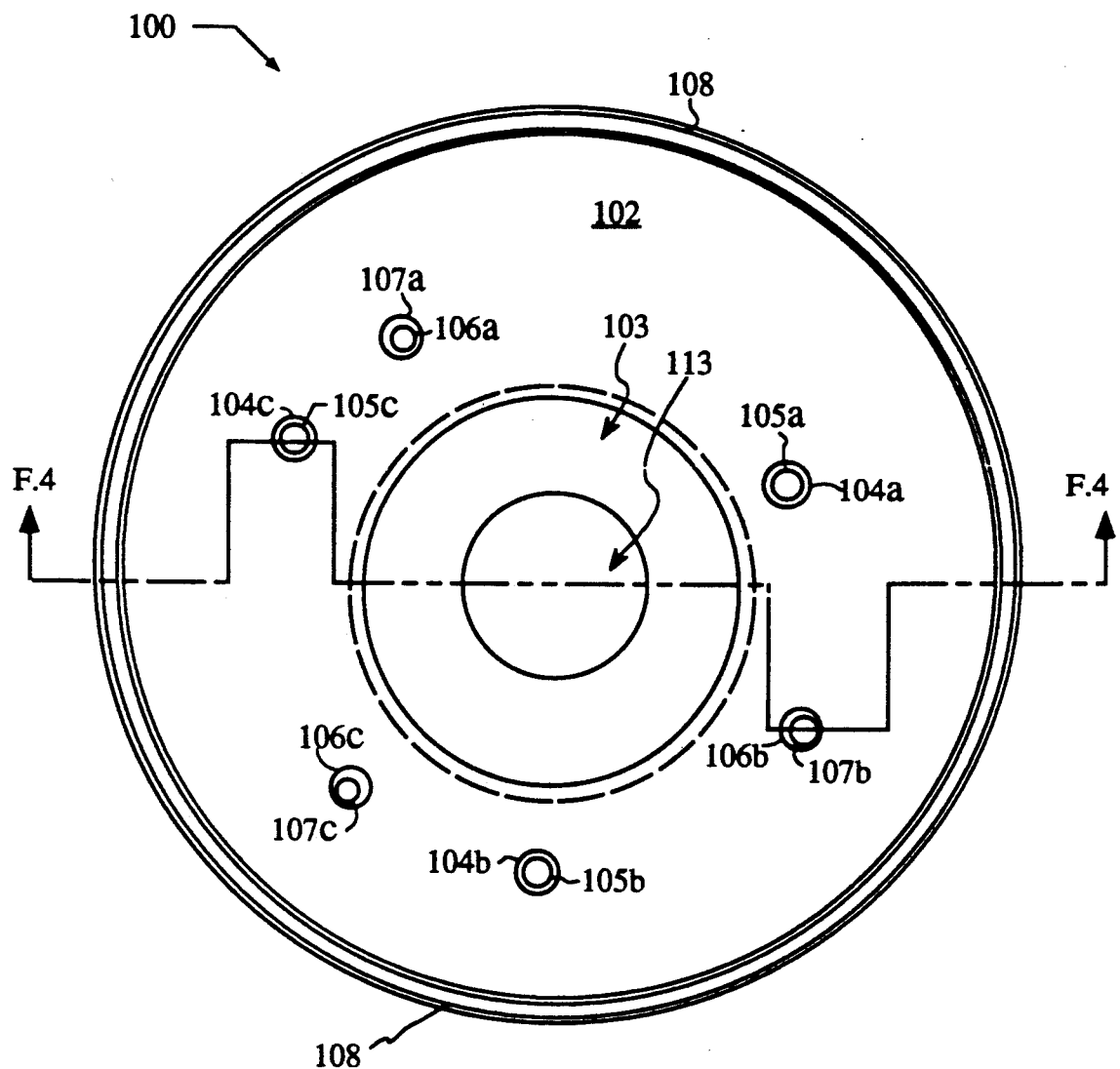
FIG. 3 is a top plan view of a pedestal base illustrative of the pedestal bases shown in FIG. 2.
Figure 4:
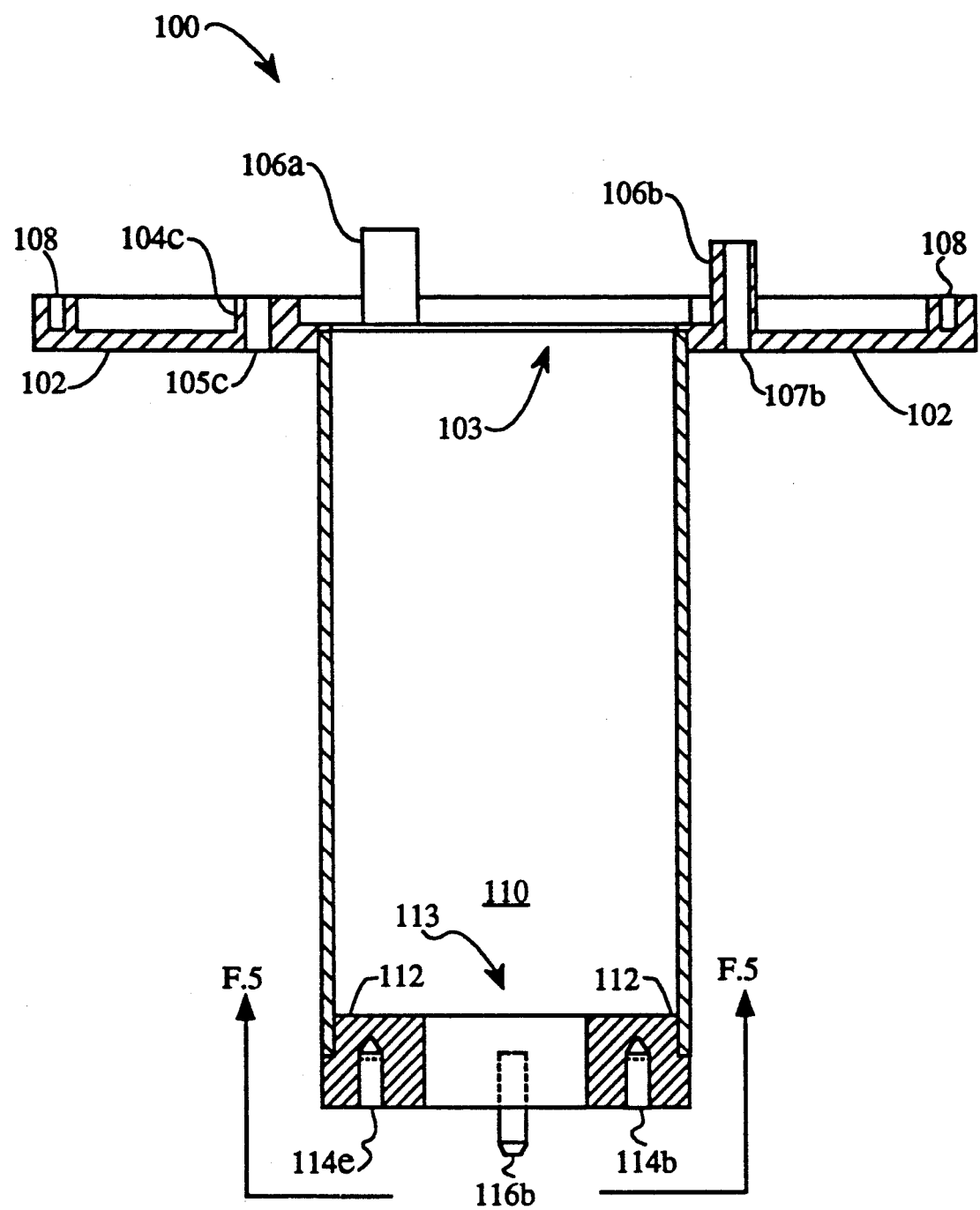
FIG. 4 is a cross-sectional view of the pedestal base of FIG. 3.
Figure 5:
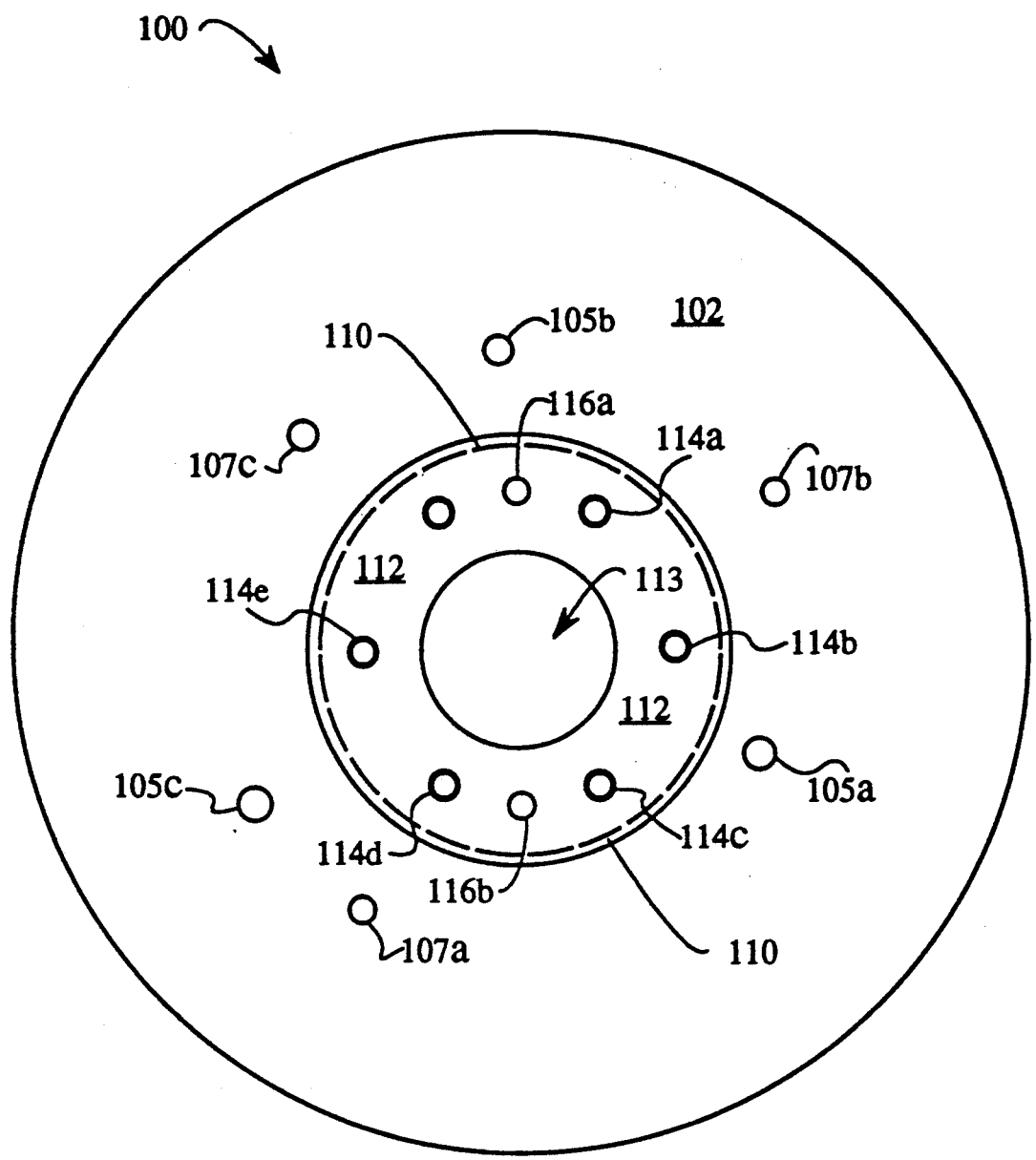
FIG. 5 is a bottom plan view of the pedestal base of FIG. 4.
Figure 8:
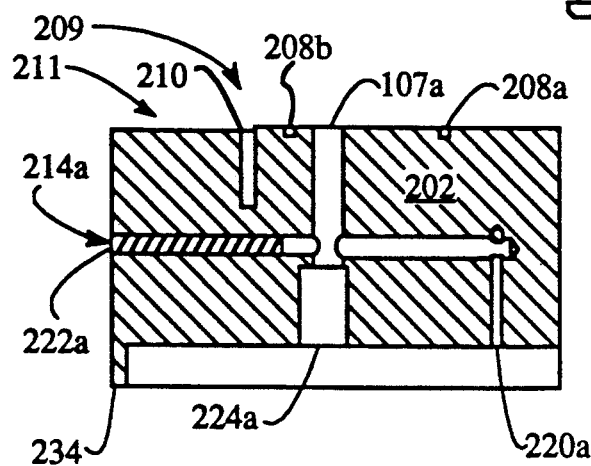
Figure 9:
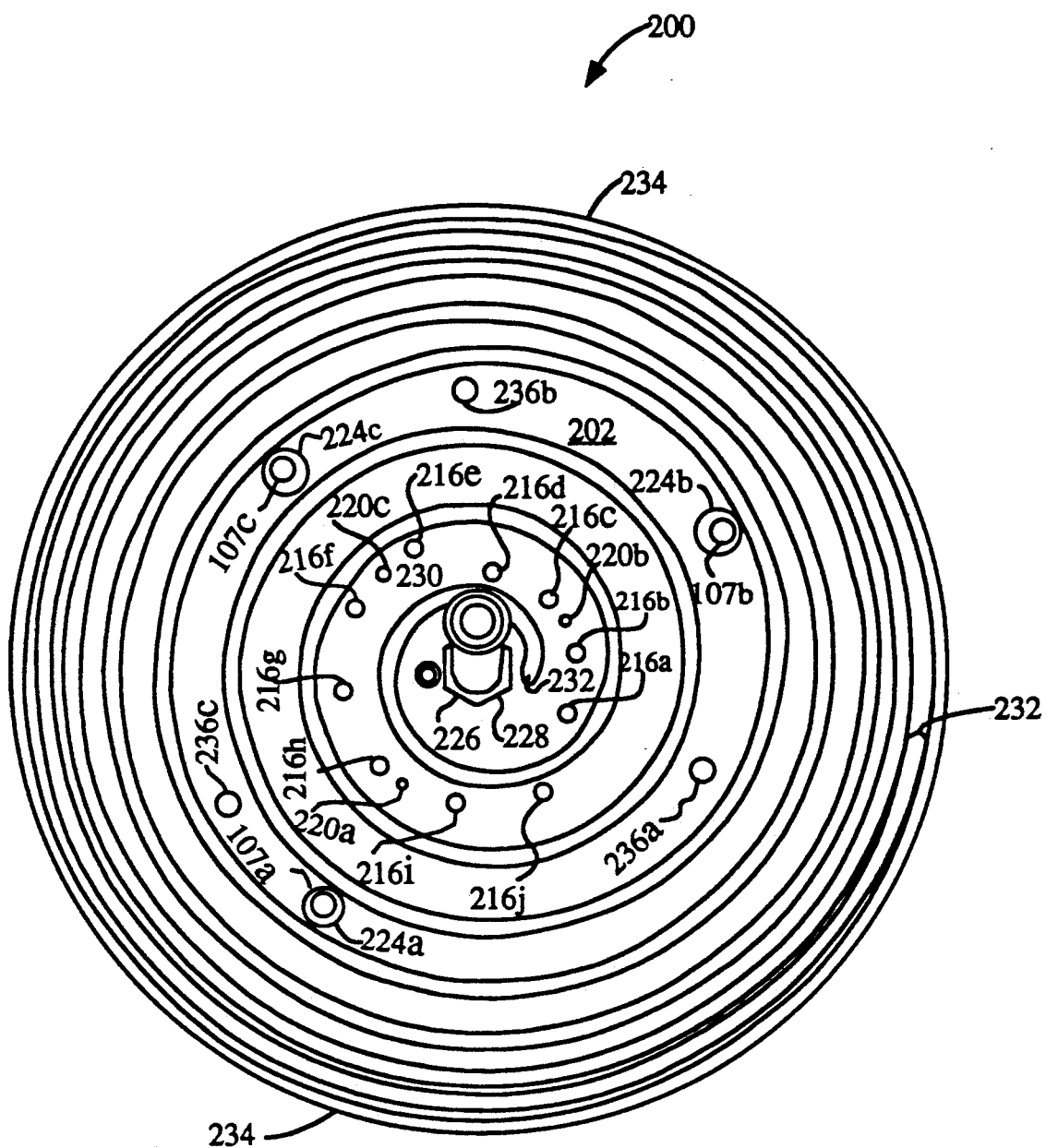
FIG. 9 is a bottom plan view of the platen of FIG. 6.

A pedestal base 100 illustrative of pedestal bases 16b, 16c and 16d is shown in detail in FIGS. 3, 4 and 5. In the top plan view of FIG. 3 and the bottom plan view of FIG. 5, the most prominent feature is the base plate 102. Base plate 102 is made of aluminum. Other suitable materials include certain metal or ceramic alloys, including stainless steel and nickel, that can be used in the reactive process environment without being degraded. Three holes 105a, 105b and 105c through base plate 102 and respective spacing sleeves 104a, 104b and 104c, which protrude from base plate 102, accommodate screws (not shown) used to connect illustrative platen assembly 200 (FIG. 6) to the base pedestal 100. The outside diameter of the spacing sleeves 104a-104c is 0.31 inches, and the top of spacing sleeves 104a-104c is 0.41 inches from the bottom surface of the base plate 102. Three other holes 107a, 107b and 107c through base plate 102 and respective index sleeves 106a, 106b and 106c are 0.19 inches in diameter for accommodating wafer lifting pins such as, for example, pins 20c, 21c and 22c of FIG. 2. Sleeves 106a-106c are 0.31 inches in diameter and rise 0.75 inches from the upper surface of the base plate 102 to engage respective holes 224a-224c of platen 200 (FIGS. 8 and 9). Holes 107 are 0.19 inches in diameter and eccentric with respect to their respective sleeves 106, although they may be concentric if desired. An annular groove 108 is provided in base plate 102 to accommodate the platen 200 and provide a seal between the platen 200 and the base pedestal 100. The top of groove 108 is 0.41 inches from the bottom surface of the base plate 102.

The pedestal 110 and pedestal mounting block 112 are visible in FIG. 4. Pedestal 110 is made of tubular aluminum or other suitable material, and is welded at its outside diameter to the bottom of the base plate 102 at a circular opening provided therein. The annular mounting block 112 also is aluminum or other suitable material, and is provided with pin holes 114a-114f and index pins 116a and 116b for mounting on the floor of the process chamber in any suitable manner. The mounting block 112 is inserted into the pedestal 110 and welded thereto.

Figure 6:
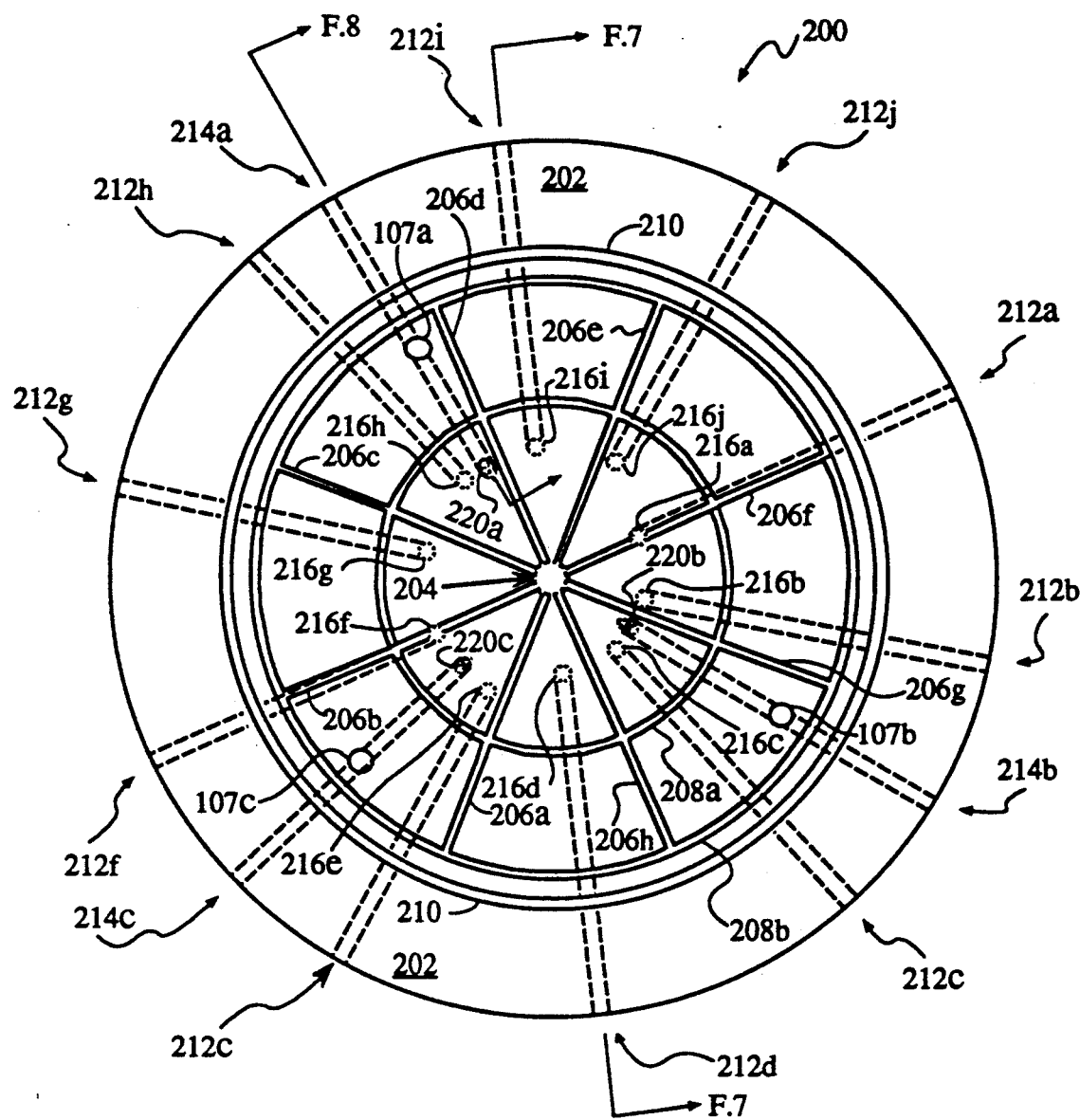
FIG. 6 is a top plan view of a platen illustrative of the platens shown in FIG. 2.
Figure 7:
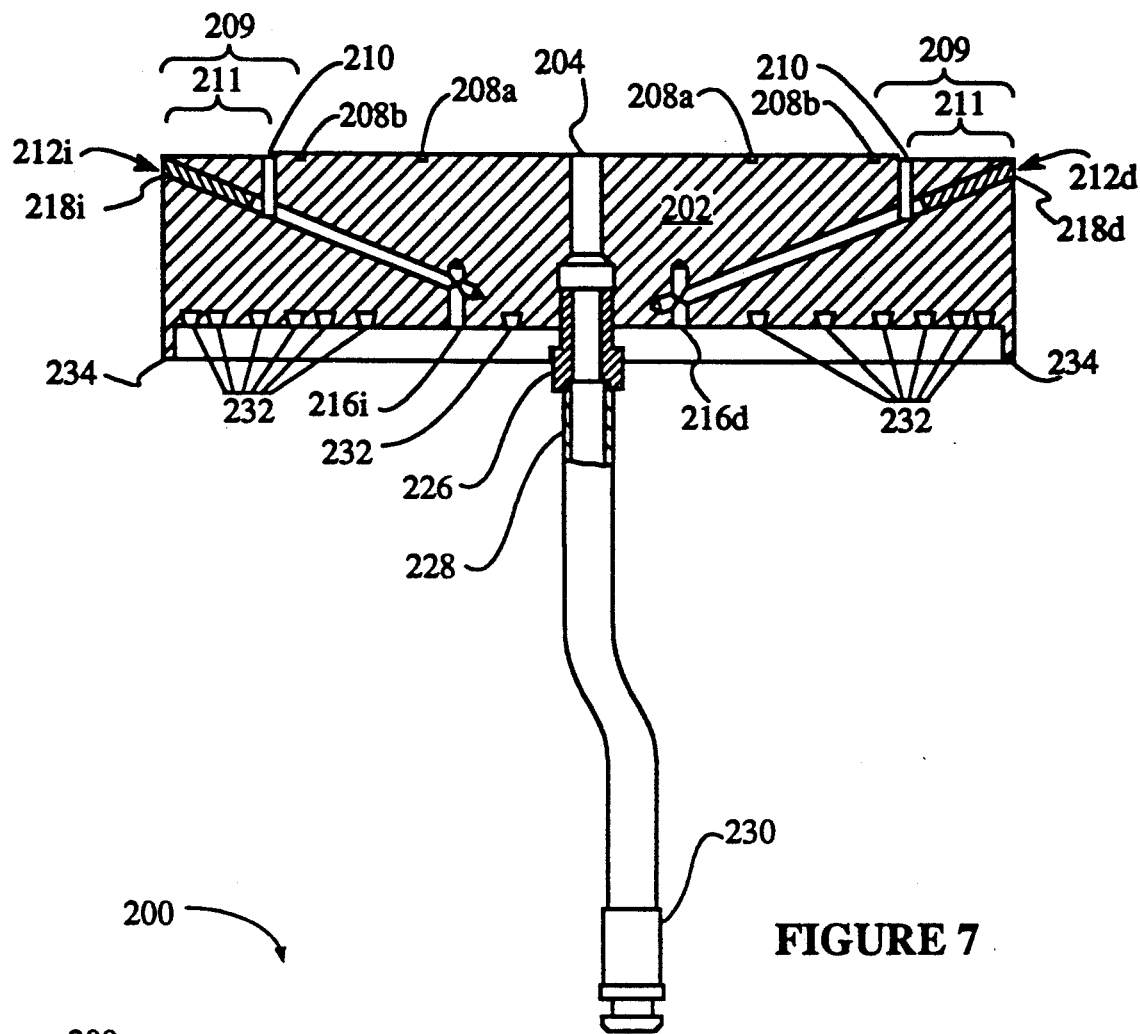
FIGS. 7 and 8 are views through different cross-sections of the platen of FIG. 6.

An illustrative platen 200 is shown in FIGS. 6, 7 and 8. The major component of the platen 200 is a circular block 202 of aluminum or other suitable material such as stainless steel. As viewed from the top, the upper surface of the platen block 202 is provided with a vacuum line 204, which appears as a central orifice from which radial vacuum grooves 206a-206h extend. The vacuum line 204 is 0.25 inches in diameter, and extends through the platen block 202. The radial grooves 206a-206h are rectangular in cross section, although other shapes are suitable as well, and are 0.06 inches deep and 0.06 inches wide. The eight radial grooves 206a-206h are regularly disposed at forty-five degree angles from one another. Radial grooves 206a-206h intersect concentric annular vacuum grooves 208a and 208b, which like the radial grooves 206a-206h are rectangular in cross section and measure 0.06 inches deep and 0.06 inches wide. The outer radius of the inner annular groove 208a is 1.41 inches, and the outer radius of the outer annular groove 208b is 2.40 inches. An annular gas groove 210 is provided in the peripheral region of the top surface of platen block 202. The annular groove 210 is rectangular in cross section, measuring 0.09 inches wide and 0.50 inches deep. The outside radius of the gas groove 210 is 2.64 inches.

The gas groove 210 is provided within a peripheral region 209 of the top surface of the platen block 202 outside of the outermost annular vacuum groove 208b. As shown in FIG. 7, a portion 211 of the peripheral region 209 is depressed with respect to the top surface of the platen block 202. The depression shown in FIG. 7 is 0.01 inches. Other configurations of the peripheral region 209 include having portion 211 level with or elevated above the top surface of the platen block 202, and providing a baffle in the form of an annular ridge or ledge just beyond the diameter of the wafer to be processed.

The gas groove 210 intersects a network of radial gas lines 212a-212j for distributing gas to the backside of the wafer to be processed. Radial gas lines 212a-212j are shown in hidden lines in FIG. 6, and selectively in cross section in FIG. 7. Lines 212a-212j are radially distributed in the platen block 202 at 36 degree intervals. Each of the bores for the ten gas lines 212a-212j is 0.13 inches in diameter, begins in the vertical edge of the platen block 202 at a distance of 0.11 inches from the top surface of the platen block 202 to the bore centerline, is angled twenty degrees from the top surface of the platen block 202, and extends sufficiently into the platen block 202 to intersect a respective one of the ten vertical bores for gas lines 216a-216j, which extend from the bottom surface of the platen block 202 (FIG. 9). The gas lines 212a-212j are plugged by respective plugs 218a-218j (see, e.g., plugs 218d and 218i in FIG. 7), which extend 0.75 inches from the outside vertical edge of the platen block 202 to just short of the gas groove 210. The plugs 218a-218j are slip fitted and welded on the outside surface of the platen block 202. The diameter of the bores for gas lines 216a-216j is 0.13 inches.

A second network of radial gas lines 214a-214c are bored in the platen block 202 for distributing backside gas to holes 107a-107c, which accommodate wafer lift pins such as 20c, 21c and 22c shown in FIG. 2. Radial gas lines 214a-214c are shown in hidden lines in FIG. 6, and selectively in cross section in FIG. 8. Each of the bores the three gas lines 214a-214c is 0.13 inches in diameter, begins in the vertical edge of the platen block 202 a distance 0.76 inches from the top surface of the platen block 202 to the bore centerline, is parallel to the top surface of the platen block 202, and extends sufficiently into the platen block 202 to intersect a respective one of the three vertical bores for gas lines 220a-220c, which extend from the bottom surface of the platen block 202 (FIG. 9). The gas lines 214a-214c are plugged by respective plugs 222a-222c (see, e.g., plug 222a in FIG. 8), which extend 0.75 inches from the outside vertical edge of the platen block 202 to just short of the respective gas lines 220a-220c. The plugs 222a-222c are slip fitted and welded on the outside of the platen block 202. The diameter of the bores for gas lines 220a-220c is 0.06 inches.

Holes 107a-107c, which accommodate wafer lift pins such as 20c, 21c and 22c shown in FIG. 2, are 0.19 inches in diameter and pass through platen block 202. Toward the bottom surface of the platen block 202, holes 107a-107c merge into, respectively, index holes 224a-224c, which are 0.31 inches in diameter and provided to receive respective index sleeves 106a-106c of the base pedestal 100 (FIG. 3). The center axes of holes 107a-107c are offset from, respectively, the center axes of holes 224a-224c, to accommodate the eccentricity between holes 107a-107c and sleeves 106a-106c.

The platen 200 also accommodates vacuum line 204, which is a 0.25 inch bore drilled through the center of the platen block 202. Toward the bottom surface of the platen block 202, vacuum line 204 merges with a hole which receives an aluminum press-fit fixture 226, which is welded to the platen. The fixture 226 has a channel through it for receiving aluminum tube 228, which is welded to it. At its other end, tube 228 is welded to a suitable aluminum vacuum fitting 230.

Figure 10:
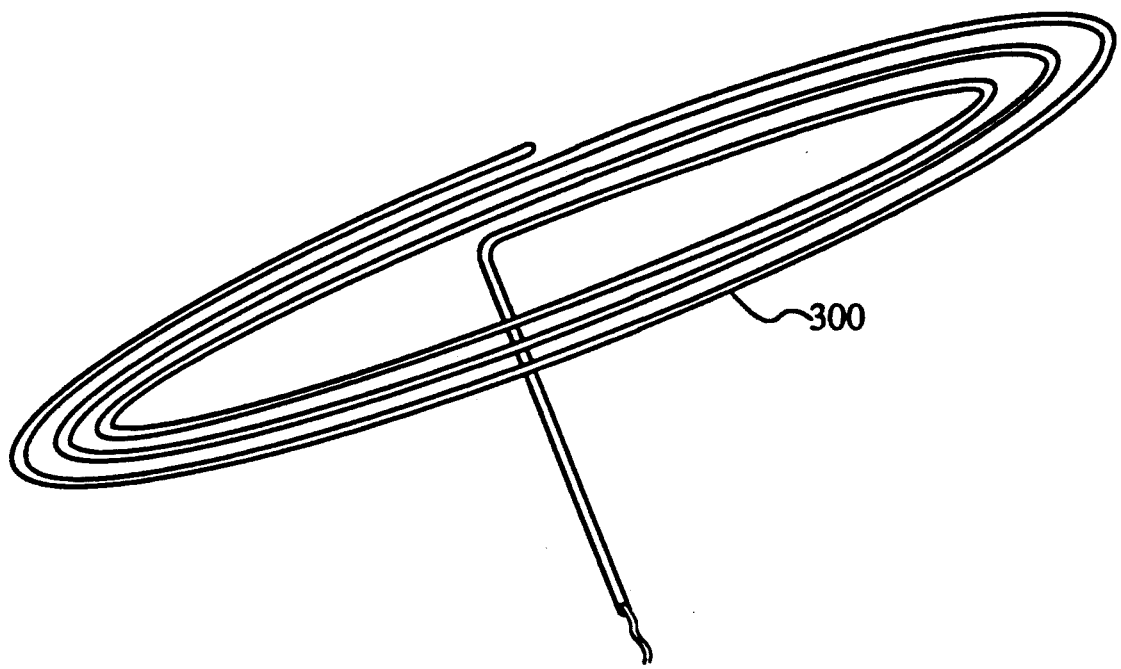
FIG. 10 is a plan view of a heating element.

The bottom of platen block 202 is provided with a spiral groove 232, to accommodate a heating element such as element 300 shown in FIG. 10. The groove 232 is variably pitched to provide a uniform distribution of heat in the platen 200, and is suitably sized to receive heating element 300. The heating element 300 is made of any suitable soft heat-conductive material, and is slip- or press-fitted into the platen block 202. The resistance of the fit and the radial force exerted by the spiral act to securely retain the heating element 300 in the groove 232.

The base pedestal 100 is assembled to the platen 200 by aligning the index sleeves 106a-106c extending from the top of the base plate 102 with the index holes 224a-224c in the bottom of the platen block 202, and bringing together the pedestal base 102 and the platen 200 so that annular flange 234 extending from the bottom of block 202 is set within the annular groove 236 in the base plate 102. The annular flange 234 has an inside diameter of 6.91 inches, and is 0.18 inches wide and 0.259 inches in length. The groove 108 has an inside diameter of 6.81 inches and an outside diameter of 7.01 inches; hence is 0.20 inches wide. The tip of flange 234 and the bottom of groove 108 are serrated in a mating pattern for providing a gas seal. The base pedestal 100 and the platen 200 are secured to one another by the use of screws (not shown), which passed through holes 105a-105c from the bottom of the base plate 102 (FIG. 5) and engage respective threaded holes 236a-236c in the bottom of the platen block 202.

It will be appreciated that the base pedestal 100 and the platen 200 may be made by a variety of different techniques. For example, the base pedestal 100 and platen 200 may be machined from a single block of material, or the base pedestal 100 may be manufactured with a different shape, or the platen 200 may be assembled from a variety of tubes and plates. In the event that the base pedestal 100 and the platen 200 are separate components, they may be joined by any number of different techniques, including welding, clamping, and gluing.

Although load/lock station 5 as shown is different from the process stations 4a-4e, it will be understood that load/lock station 5 could be nearly identical to the process stations 4a-4e, retaining the major components thereof, including the lift pin holes 107a-107c, but lacking the groove 210 and the various gas lines 212a-212j and 216a-216j of the backside gas system, and the various grooves 206a-206h and 208a-208b and gas line 204 of the vacuum chuck system. Alternatively, the load/lock station 5 could be identical to the process stations 4a-4e for providing additional processing capability.

A variety of materials including tungsten, tungsten silicide, and titanium nitride are deposited on a wafer using the apparatus of FIGS. 1 and 2 as follows. The wafer to be processed is introduced into the process chamber 2 from the load lock chamber 1 at a reduced pressure such as 40 Torr, and is received at an empty load/unload station 5 and lowered onto raised lift pins 20f, 21f and 22f. By coordinating the rotation of wafer transport mechanism 10 and the raising and lowering of the lift pins 20a-20f, 21a-21f, and 22a-22f, the wafers are transported to successive ones of the stations 4a-4e and 5. The wafer at the load/lock station 5, which is fully processed, is removed into the load lock chamber 1.

When the pins 20a-20f, 21a-21f, and 22a-22f at the stations 4a-4e and 5 lower, the wafers to be processed are deposited on respective platens 14a-14e under respective gas dispersion heads 12a-12e. Once the wafers are deposited on the respective platens 14a-14e, a suitable vacuum such as, for example, a pressure 20-40 Torr less than the process chamber pressure, is maintained in the vacuum clamps of the respective process stations 4a-4e. The term "vacuum" is used herein in a relative sense to mean a pressure less than another pressure, e.g. the pressure in the vacuum clamps at the respective process stations 4a-4e relative to a pressure in the process chamber 2. Each of the platens 14a-14e includes vacuum grooves such as radial grooves 206a-206h and annular grooves 208a-208b for holding a wafer in place on the surface of the platen block 202, thereby creating a vacuum clamp. The vacuum is exerted through vacuum line 204, tube 228, and fitting 230.

Once the vacuum clamps at stations 4a–4e are activated, a gas is introduced at the backside of the wafers at the stations 4a–4e. The introduction of the backside gas is coordinated with the introduction of a process gas at the gas dispersion heads 12a–12e. To better appreciate the function of the backside gas, consider the illustrative platen 200 of FIGS. 6–9. The backside gas is introduced into the space between the wafer backside and the surface of the platen block 202 in the peripheral region 209 (in the embodiment of FIGS. 7 and 8, the region 211) through annular groove 210, even if the peripheral region 209 is even with the top surface of the platen block 202. The combined force exerted through the vacuum grooves 206a–206h and 208a–208b and the gas dispersed directly upon the wafer, the latter being somewhat in excess of the process pressure in chamber 2, is sufficient to overcome the opposite force exerted by the backside gas pressure developed under the wafer in the peripheral region 209. The volume of backside gas furnished to the groove 210 is determined based on the desired rate of venting from underneath the wafer's edge and the effect of the backside gas on the wafer frontside deposition.

The backside gas vents from beneath the wafer's edge, which is disposed over the peripheral region 209, into the process chamber 2. In the process chamber 2, the backside gas mixes with the process gas and is vented through the vent ports 6a–6f. The presence of the backside gas over the peripheral region 209 and the outward flow from the peripheral region 209 past the wafer edge and into the process chamber 2 sufficiently impedes the process gas from reaching any portion of the wafer backside, thereby preventing backside deposition.

The backside gas also vents beneath the base plate 102 through the lifting pin holes 107a–107c, to prevent the process gas from reaching the area around the lifting pins and the wafer backside through the lift pin holes 107a–107c.

The backside gas is introduced into the interior volume of the pedestal 110 through orifice 113 in the block 112, and into the interior volume under the platen block 202 and about the heating element 300 through the orifice 103 in the base plate 102. From the interior volume of the pedestal and under the platen block 202, the backside gas enters gas lines 216a–216j and flows from there to groove 210 through respective gas lines 212a–212j. The backside gas also enters gas lines 220a–220c, from which it flows to lift pin holes 107a–107c through respective gas lines 214a–214c. As gas lines 220a–220c are smaller than gas lines 216a–216j, the flow through them is relatively restricted. The backside gas is heated both within the volume under the platen block 202 and as it flows through the various gas lines.

A variety of process gases and backside gases may be selected. For example, in depositing a tungsten film at a deposition rate of 2000 Å/min, for example, the product reactant $WF_6$ is used under the reactant conditions of $H_2$ and Ar at a deposition temperature of 400 degrees C. and an operating pressure of 40 Torr. In the apparatus of FIGS. 1 and 2, the flow of process gas to each of the dispersion heads 12a–12e is on the order of two standard liters per minute. The actual pressure on the wafer being processed is somewhat greater than 40 Torr because the gas stream from the dispersion head impinges directly on the surface of the wafer. Under these process conditions, a suitable backside gas is Argon or a mixture of Argon and Hydrogen in proportion to the mixture of Argon and Hydrogen introduced through the gas dispersion heads 12a–12e into the process chamber 2. The various constituent gases are delivered to and mixed in a suitable manifold, as is well known in the art. The flow of backside gas provided to each of the process stations 4a–4e under such conditions ranges from about 500 standard cubic centimeters per minute to about 3 standard liters per minute.

Uniformity of deposition near the edge of the wafers being processed is further improved by mixing a reactant gas with the selected inert gas or gases to obtain the backside gas. In the example of the preceding paragraph in which the product reactant $WF_6$ is used with the reactant gas $H_2$ and the carrier gas Ar or $N_2$ or a mixture of Ar and $N_2$, improved uniformity of edge deposition is obtained by mixing the reactant gas $H_2$ with Ar or $N_2$ or a mixture of Ar and $N_2$ to obtain the backside gas. The proper proportion of reactant gas to inert gas is determined empirically, as follows. Optimize the process gas mixture (e.g. $WF_6+H_2+Ar$) for the desired results at the center of the wafer. Adjust the backside gas mixture so that the proportion of reactant gas to carrier gas (e.g. $H_2$:Ar) is reproduced in the backside gas mixture (e.g. $H_2+Ar$). Vary the proportion of gases in the backside gas (e.g. $H_2$:Ar) through several wafer test runs to determine which proportion yields the best uniformity, and select that proportion for production. From ten to twenty percent variation from the starting proportion to the final determined proportion is to be expected.

Suitable inert gases for use in the backside gas mixture include argon, nitrogen, helium, freon, $C_2F_6$, or $CF_4$, or any suitable combination thereof. An inert gas is any gas that does not react adversely with the materials present in the process chamber 2 and in the gas distribution system, and that does not participate in the chemical reactions involved. Moreover, it is desirable that the thermal conductivity and heat capacity of the inert gas be sufficient to achieve good temperature uniformity across the wafers being processed.

Figure 11:
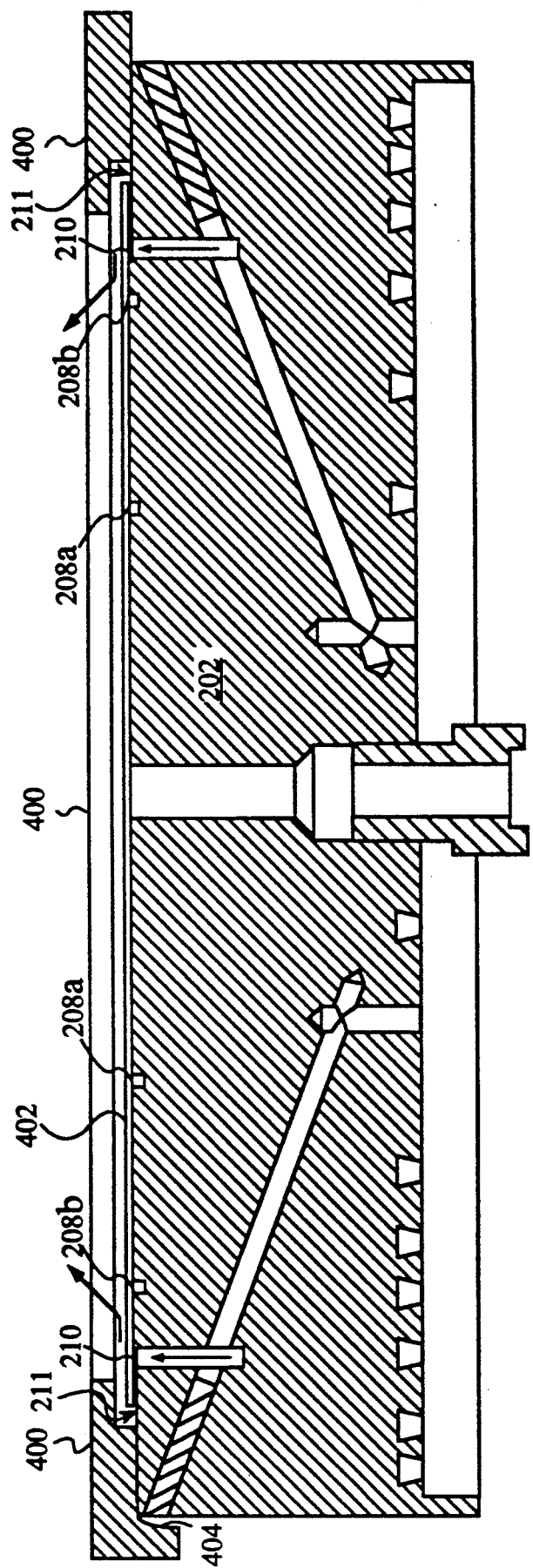
FIG. 11 is a cross section view of a portion of the platen of FIG. 7 showing an additional "shroud" feature.

In some deposition operations, and particularly in the CVD deposition of metals and metal compounds such as tungsten, titanium nitride, and silicides, one may wish to exclude deposition of material not only from the wafer backside, but also from the edge and a peripheral portion of the wafer frontside This result is achieved by the use of an annular "shroud" structure such as the structure 400 illustrated in FIG. 11.

A wafer such as wafer 402 is held in place on the platen block 202 by any suitable means, such as the vacuum clamp comprising radial grooves 206a–206h and annular grooves 208a–208b described above. The shroud 400, which is of any suitable material such as metal or ceramic (including, for example, alumina), is an annular structure suitably relieved at its inside basal region to create a suitable cavity for containing the edge and a peripheral portion of the frontside of the wafer on which deposition is to be excluded For example, a suitable cavity is created by relieving the inside basal region, as shown in FIG. 11.

While the dimensions of the shroud 400 are not critical, they are selected in accordance with the dimensions of the wafer 402 and the flow capacity of the backside gas delivery system. For example, the dimensions listed in Table 1 for the various wafer sizes are suitable.

TABLE 1

| Wafer Diameter | Platen Diameter | Shroud OD | Relieved Refion OD | Shroud-Relieved Relieved Region ID |
|---|---|---|---|---|
| 5" | 7" | 8" | 5.14" | 4.43" |
| 6" | 7" | 8" | 6.14" | 5.43" |
| 8" | 9" | 10" | 8.14" | 7.43" |

Note that in Table 1, "OD" means outside diameter, and "ID" means inside diameter. For many wafers, a relief of 0.047 inches is suitable.

If precise alignment accuracy is desired, the shroud 400 may be provided with any suitable type and arrangement of alignment means such as, for example, hole-pin pairs (not shown) or slot-wedge pairs (not shown) provided within the contact region of the shroud 400 with the peripheral region 211 of the platen block 200. Another such alignment means, which is illustrated in FIG. 11, involves the use of three or more flanges such as 404, which are spaced along the outside edge of the shroud 400 and extend down in such a manner as to engage the outside edge of the platen block 202 and compel alignment of the shroud 400 with the platen block 202, hence with the wafer 402. The flange members 404 may be tapered as shown to engage progressively the outside edge of the platen block 202.

Figure 12:
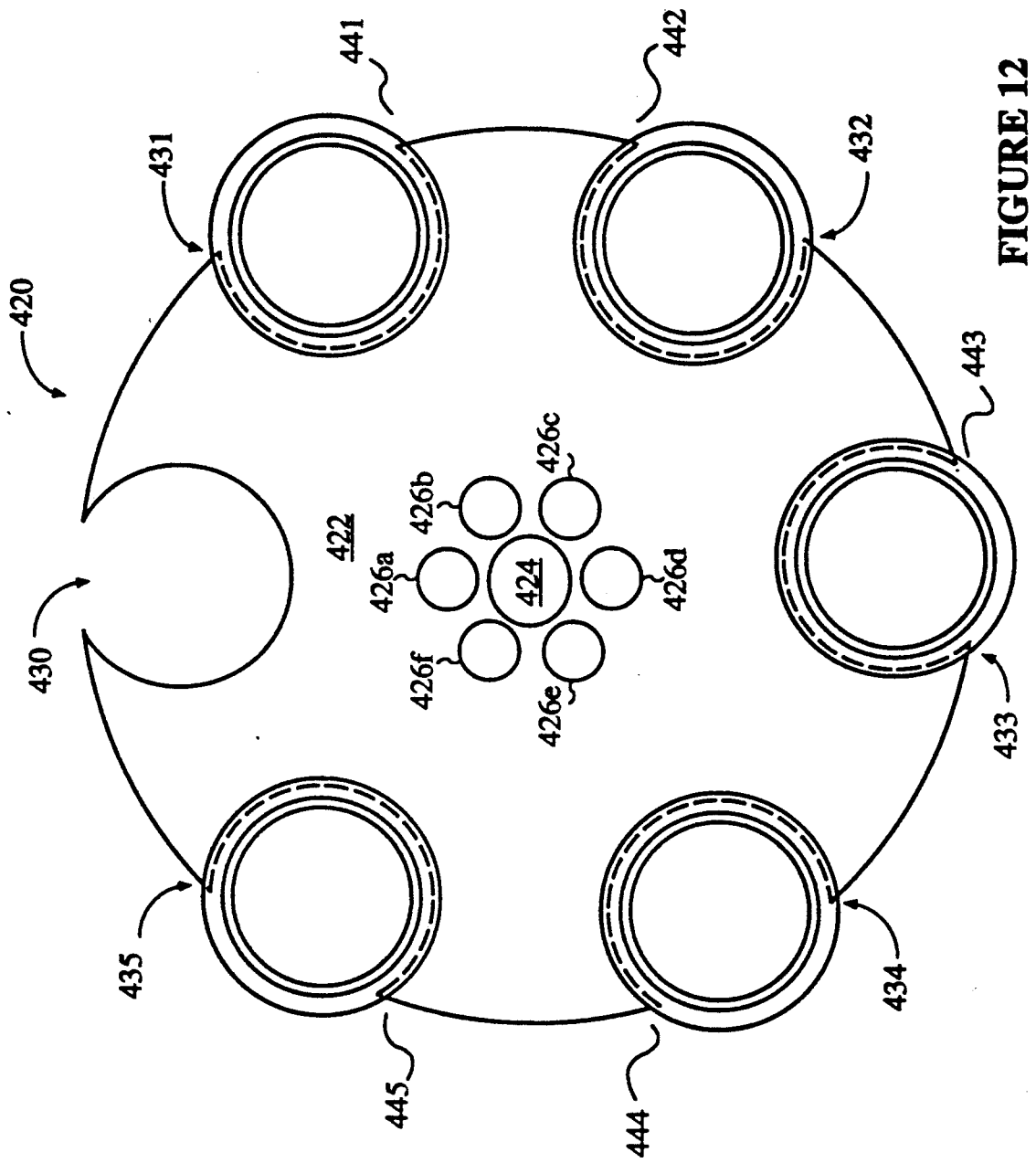
FIG. 12 is a top plan view of a shroud lift assembly.

The process stations 4a–4e within process chamber 2 are either shrouded or unshrouded as desired. A shroud lift assembly 420 suitable for shrouding or unshrouding the process stations 4a–4e is shown in FIG. 12. A circular shroud lift plate 422 is provided with six semi-circular cutout regions 430–435 respectively associated with the process stations 4a–4e and the load/unload station 5. Cutout regions 431–435, which are associated with the process stations 4a–4e, are of a diameter just greater than the diameter of the platen block but just less than the outside diameter of the shroud 400, and are designed to engage respectively five shrouds 441–445 similar to the shroud 400. Typically, all of the process stations 4a–4e are either shrouded or unshrouded, although the process stations 4a–4e may be variously shrouded and unshrouded as desired merely by mounting or omitting respective ones of the corresponding shrouds 441–445. The shrouds 441–445 are engaged by the shroud lift plate 422 in any suitable manner. For example, in FIG. 12, the shrouds 441–445 are respectively aligned with cutout regions 431–435 and are merely contacted and lifted by the upper surface of the shroud lift plate 422 as the shroud lift plate 422 rises above the platen block 202. Note that the shrouds 441–445 are accessible for cleaning and changing merely by removing the top of the process chamber 2. Note also that no shroud is mounted to the shroud lift plate 422 at cutout region 430, which is associated with the load/unload station 5.

Figure 13:
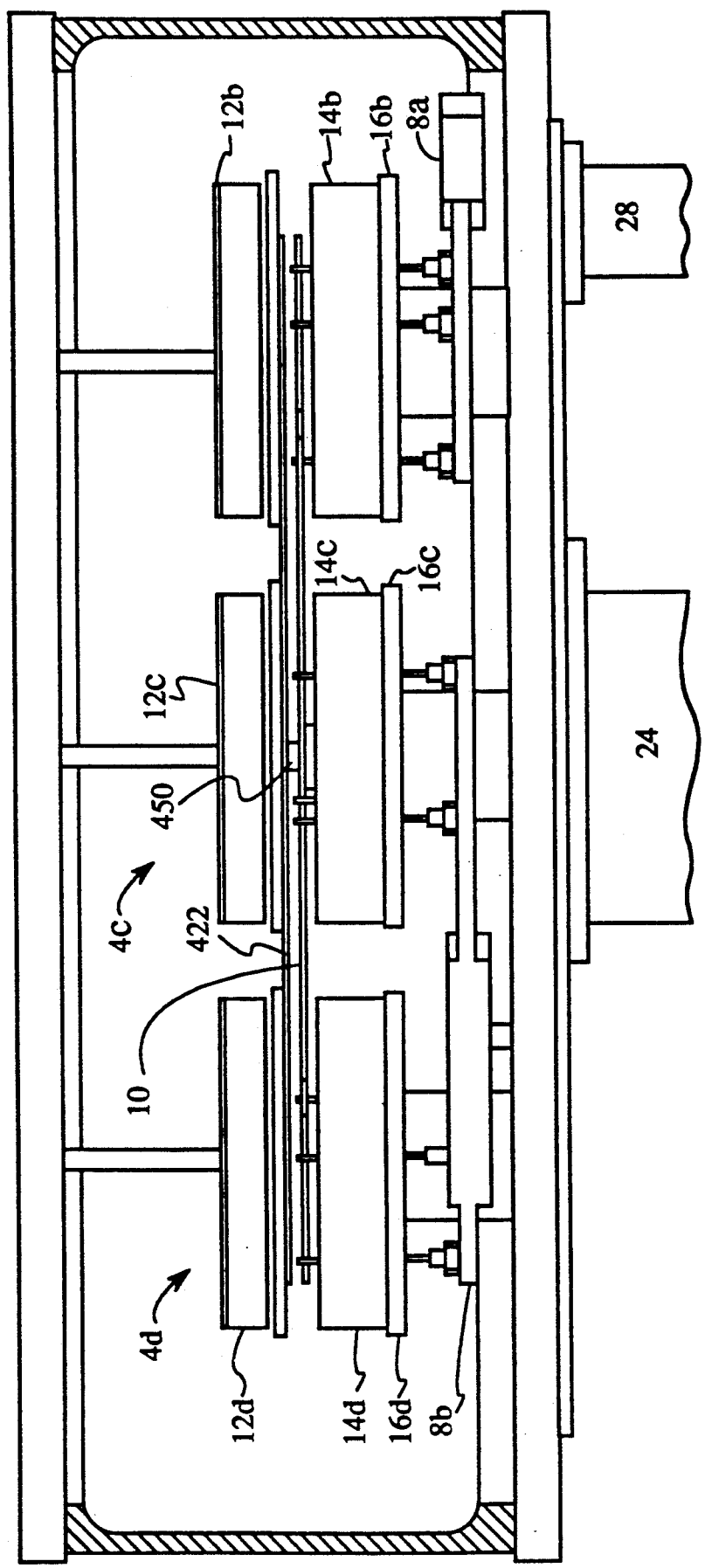
FIG. 13 is a cut away plan view of a portion of the process chamber of FIG. 1, as viewed from a side, showing additional and modified features, including the shroud lift assembly of FIG. 12.
Figure 14:
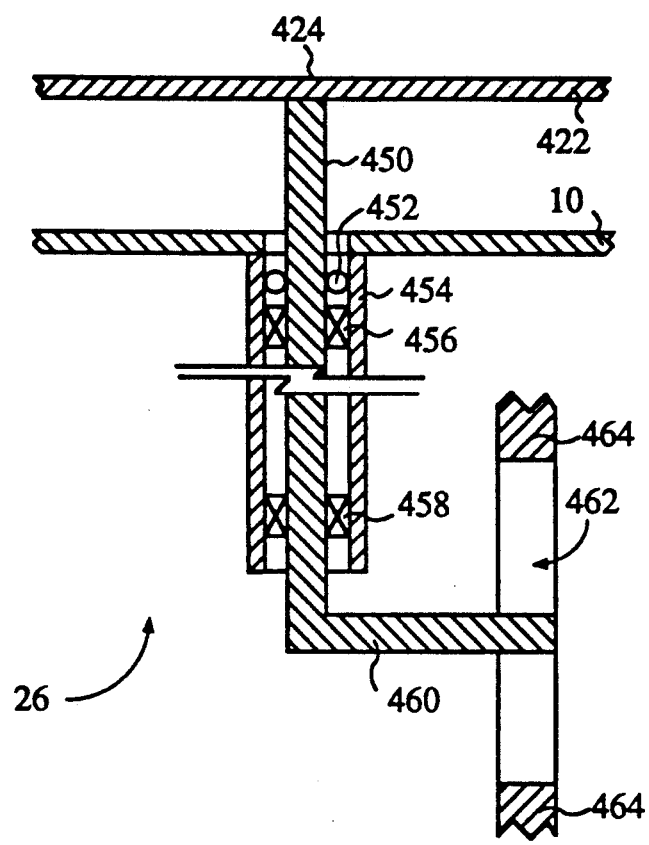
FIG. 14 is a cross section view showing a relationship of the shroud lift assembly of FIG. 12 with a wafer transport mechanism.

The shroud lift assembly 420 is mounted within process chamber 2 as shown in FIG. 13. A suitable mechanism is provided for coupling the shroud lift assembly 420 in vertical movement with the wafer transport mechanism 10, while allowing the shroud lift mechanism to be rotationally static relative to the process stations 4a–4e during rotation of the wafer transport mechanism 10. For example, in the approach shown in FIG. 14, a shaft 450 is rigidly coupled to the shroud lift plate 422 at the mounting point 424 by any suitable means, such as, for example, by bolting or welding. The shaft 450 extends into the spindle lift/rotation mechanism 26 (portions omitted for clarity) through a hollow shaft 454 that supports the wafer transport mechanism 10, and a seal such as, for example, O-ring 452 is provided to prevent particulates generated by the mechanical operations inside the spindle lift/rotation mechanism 26 from contaminating the process chamber 2. Inside the spindle lift/rotation mechanism 26, bearings 456 and 458 couple the shafts 450 and 454 for vertical motion, and decouple the shafts 450 and 454 for rotational motion. The shaft 450 includes a rigid extension 460 that engages a vertical slot 462 in a block 464. The block 464 is stationary relative to the process chamber 2. The engagement of the extension 460 with the slot 462 in block 464 prevents the shroud lift assembly 420 from rotating relative to the wafer transport mechanism 10 while allowing vertical movement. In an alternative approach, a bearing (not shown) is rigidly mounted on the shroud lift plate 422 at point 424. The bearing rotationally engages a race (not shown) coaxially and rigidly mounted on the top of the wafer transport mechanism 10. The bearing rotationally decouples the shroud lift assembly 420 from the wafer transport mechanism 10. A rigid extension (not shown) of the shroud lift plate 422 engages a vertical slot provided at a convenient location on the wall of the process chamber 2, which prevents the shroud lift assembly 420 from rotating while allowing vertical movement.

Figure 1:
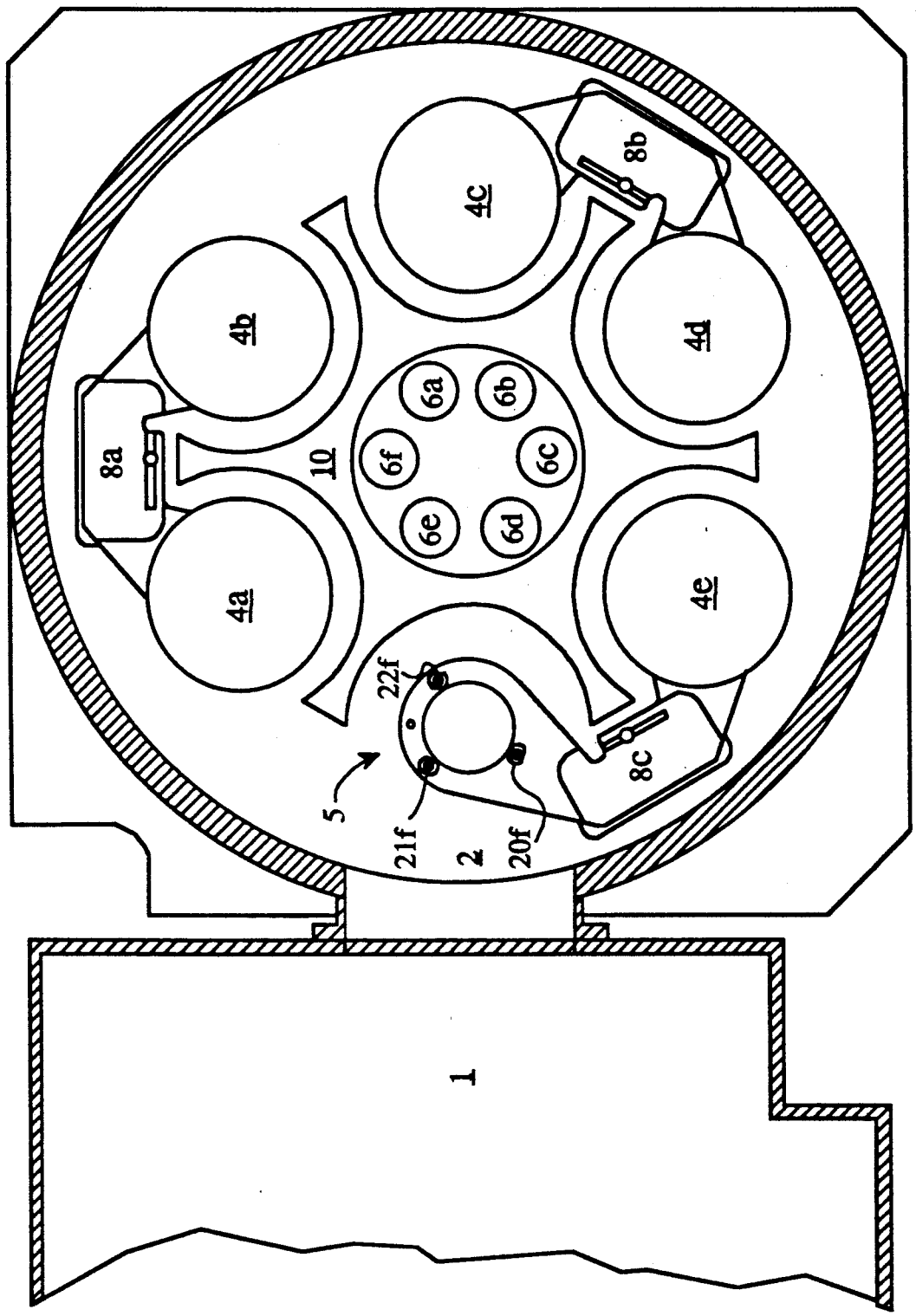
FIG. 1 is a cut away plan view of a process chamber for a chemical vapor deposition system, as viewed from above.

The operation of the apparatus of FIGS. 12 and 13 is the same as the operation of the apparatus of FIGS. 1 and 2, except as augmented by the function of the shroud lift assembly 420. The wafer to be processed is introduced into the process chamber 2 from the load lock chamber 1, and is received at an empty load/unload station 5 and lowered onto raised lift pins 20f, 21f and 22f. By coordinating the rotation of wafer transport mechanism 10 and the raising and lowering of the lift pins 20a–20f, 21a–21f, and 22a–22f, the wafers are transported to successive ones of the stations 4a–4e and 5. As the wafer transport mechanism 10 rises toward a level suitable for engaging wafers at the stations 4a–4e and 5, the shroud lift plate 422 also rises, thereby lifting shrouds 441–445 to clear the space above the process stations 4a–4e for transport of the wafers. As the wafer transport mechanism 10 lowers from the level suitable for engaging wafers at the stations 4a–4e and 5, the shroud lift assembly 420 also lowers. Note that the motion of lift pins 20a–20f and 22a–22f follows the upward motion movement of transport mechanism 10 and shroud lift assembly 420, and proceeds the downward movement of transport mechanism 10 and shroud lift assembly 420.

When the shroud lift assembly 420 is lowered, the shrouds 441–445 are deposited on the top of the platens at the respective process stations 4a–4e, thereby shrouding the wafers. Various measures may be taken to retain the shrouds 441–445 in place. For example, FIG. 11 shows an approach in which the shrouds 441–445 are made to be of a suitable weight so that gravity acts to resist the displacement force applied by the backside gas.

Once the vacuum clamps at stations 4a–4e are activated, a gas is introduced at the backside of the wafers at the stations 4a–4e. The introduction of the backside gas is coordinated with the introduction of a process gas at the gas dispersion heads 12a–12e. The volume of backside gas furnished to the groove 210 is determined based on the desired rate of venting of the backside gas from between the shroud and the wafer frontside. Note that the use of the shroud may in some instances permit a reduction in the volume of backside gas furnished to the groove 210. As shown by the flow arrows in FIG. 11, the backside gas introduced into groove 210 flows first under the wafer 402, then past the edge of the wafer 402, then over a periphery of the front side of the wafer 402, and then into the ambient of the process chamber 2. In the process chamber 2, the backside gas mixes with the process gas and is vented through the vent ports 426a-426f and 6a-6f. The presence of the backside gas over the peripheral region 211 and the outward flow from the peripheral region 211 past the edge of wafer 402 and into the process chamber 2 via the top periphery of the wafer 402 sufficiently impedes the process gas from reaching the wafer backside, edge and top periphery, thereby preventing deposition on these surfaces.

While our invention has been described with respect to the embodiments and variations set forth above, these embodiments and variations are illustrative and our invention is not to be considered limited in scope to these embodiments and variations. For example, the various shapes and dimensions and the various flow rates and pressures set forth herein are illustrative, and other shapes, dimensions, flow rates, and pressures may also be effective for the intended purpose. Moreover, the deposition process discussed herein is illustrative, and other processes may also be effective for the intended purpose. Accordingly, other embodiments and variations not described herein are to be considered within the scope of our invention as defined by the following claims.

What is claimed is:

1. An apparatus for supporting a substrate in a process chamber of a chemical vapor deposition reactor, comprising:

a platen mounted in said process chamber, said platen having a surface with an interior region and a peripheral region, said peripheral region having an inside peripheral region and an outside peripheral region;

a gas disperser operatively associated with said inside peripheral region;

a vacuum chuck operatively associated with said interior region for engaging the substrate, said inside peripheral region having a shape for establishing, in conjunction with a backside periphery of the substrate upon engagement of the substrate by said vacuum chuck, a generally thin peripherally continuous space in continuity with an outlet of said gas disperser;

a vacuum line integral with said vacuum chuck for providing a vacuum to said vacuum chuck;

a gas line integral with said gas disperser for providing gas to said gas disperser;

a shield having a first surface region enclosing a second surface region, said first surface region being shaped to contact said outside peripheral region, and said second surface region being shaped to establish a cavity in conjunction with said inside peripheral region when said first surface region is in contact with said outside peripheral region, for containing the backside peripheral region, the edge, and a frontside peripheral region of the substrate; and means for urging said shield against said platen.

2. An apparatus as in claim 1 wherein said shield is an annular member having an annularly relieved inside bottom portion, and wherein said second surface region corresponds to said annularly relieved portion and said first surface region corresponds to the bottom of said annular member.

3. An apparatus as in claim 2, wherein said inside peripheral region is depressed relative to said interior region.

4. An apparatus as in claim 3, wherein said annularly relieved portion is an annular step.

5. An apparatus as in claim 1, further comprising a pedestal base mounted in said process chamber, said platen being mounted on said pedestal base and a lower surface of said platen and an interior section of said pedestal base forming an enclosed volume for receiving a pressurized gas; wherein said gas disperser comprises a gas groove in said inside peripheral region said gas line being integral with said gas groove and extending through said platen to said enclosed volume.

6. An apparatus for supporting a substrate in a process chamber of a chemical vapor deposition reactor, comprising:

a platen mounted in the process chamber, said platen having a platen surface for underlying the substrate;

a gas channel integral with said platen and having an opening in the platen surface;

a body having an opening therethrough, said body having a generally continuous surface enclosing the opening and comprising a portion conformal to a corresponding portion of the platen surface, an inwardly projecting portion, and a transitional portion between the conformal surface portion and the inwardly projecting surface portion;

a substrate retainer operatively associated with said platen and said body for securely engaging the substrate relative thereto; and means for urging said body against said platen;

wherein the continuous surface of said body is of a shape so that when the substrate is engaged by said substrate retainer and said body is urged against said platen, a generally thin continuous space enclosing the opening in the body and in communication with the gas channel and the process chamber is established between a peripheral frontside of the substrate and the inwardly projecting surface portion of said body, and a space is established between the edge of the substrate and the transitional surface portion f said body.

7. An apparatus as in claim 6, wherein said platen surface is of a shape so that when the substrate is engaged by said substrate retainer and said body is urged against said platen, a generally thin peripherally continuous second space is established between a peripheral backside of the substrate and said platen, wherein the second space is in communication with said gas channel and the first-mentioned space.

8. An apparatus for supporting a substrate in a process chamber, comprising:

a pedestal base;

a substantially circular platen mounted on said pedestal base, said platen having a network of substantially annular and radial vacuum grooves in an interior region of an upper surface of said platen, and a substantially annular gas groove in a peripheral region of said platen upper surface surrounding said vacuum groove network;

a plurality of bores originating within a first surface section of a bottom surface of said platen and extending at least in part radially through said platen and intersecting said gas groove at respective annular positions;

a vertical bore extending through the center of said platen, said radial vacuum grooved emanating from said vertical bore;

a tube connected at one end to said vertical bore at an intersection of said vertical bore with a bottom surface of said platen, said tube having a vacuum fixture connected at the opposite end for connection to a vacuum system; wherein at least the first surface section of said platen bottom surface and an interior section of said pedestal base form an enclosed volume for receiving a pressurized gas, said bores being in communication with said enclosed volume and said tube passing through said enclosed volume;

an annular shroud having a generally planar bottom surface adapted to contact a portion of said platen upper surface peripheral region, a portion of said shroud projecting radially toward the center thereof and raised from the plane of said bottom surface and adapted to define in conjunction with a portion of said platen upper surface peripheral region a cavity for enclosing a backside peripheral region, an edge, and a frontside peripheral region of said substrate when mounted on said platen; and means for urging said shroud against said platen.

9. An apparatus as in claim 8 further comprising means for aligning said shroud with said platen.

10. An apparatus as in claim 9, wherein said alignment means comprises at least two pin-hole pairs associated with said shroud bottom surface and said platen upper surface peripheral region.

11. An apparatus as in claim 9, wherein said alignment means comprises a wedge-slot pair associated with said shroud bottom surface and said platen upper surface peripheral region.

12. An apparatus as in claim 9, wherein said alignment means comprises at least three flanges associated with said shroud and extending beneath the bottom surface thereof, said flanges being adapted to engage progressively an outside edge of said platen.

13. An apparatus for supporting a substrate for processing in a deposition chamber, comprising:
a platen;
a substrate retainer for retaining a substrate on said platen, said substrate retainer and platen cooperatively being ineffective for sealing a periphery of the backside of a substrate against a peripheral surface region of said platen;
a gas disperser disposed in said platen peripheral surface region for introducing a backside gas over said platen peripheral surface region;
a shield having a bottom including an enclosing contact portion for contacting an enclosing contact portion of said platen peripheral surface region, and a closed relieved portion enclosed by said contact portion, a width of said relieved portion corresponding to a substrate frontside periphery and a depth of said relieved portion corresponding to thickness at a substrate edge; and
a positioner for selectively lowering said shield into engagement with said platen along said shield enclosing contact portion and said platen enclosing contact portion, and raising said shield from engagement with said platen, said shield relieved portion width and said substrate frontside periphery being juxtapositionally separated, and said shield relieved portion depth and said substrate edge being juxtapositionally separated, during said shield-platen engagement.

14. An apparatus as in claim 13, wherein said platen and said shield are annular, and said shield relieved portion is an annular step.

15. An apparatus as in claim 14, wherein the outside diameter of said shield exceeds the outside diameter of said platen, thereby forming an annular overhang; and said positioner comprises a moveable plate having a semicircular cutout of a diameter greater than said platen outside diameter and less than said shield outside diameter, said shield, said platen, and said cutout being coaxial, and said plate being adapted to contact said shield overhang along the periphery of said cutout.

16. An apparatus for supporting a semiconductor wafer in a chemical vapor deposition process chamber having a dispersion head, comprising:
a platen having a wafer receiving surface;
a wafer retainer controllably operable to retain said wafer on said platen wafer receiving surface;
a gas distributor controllably operable to introduce uniformly a gas into a volume about a periphery of said wafer; and
a shield controllable operable to reside between said wafer and said dispersion head, said shield being generally conformal with said wafer periphery for partially enclosing said volume, and having a portion extending between said wafer periphery and said dispersion head for shielding said wafer periphery from said dispersion head and for directing gas flow from said volume into said process chamber over said wafer periphery.

17. An apparatus as in claim 16, wherein said wafer retainer is a vacuum chuck.

18. An apparatus as in claim 16, wherein:
said platen includes a relieved peripheral region underlaying said wafer periphery; and
said gas distributor comprises a continuous closed groove disposed through said relieved platen peripheral region, said gas being introduced into said volume by flowing radially between under said wafer periphery and said relieved platen periphery.

19. An apparatus as in claim 18, wherein said platen includes an extended peripheral region extending beyond said relieved platen peripheral region and beyond said wafer periphery, and wherein said shield further comprises a contact section removably engaging said extended plate peripheral region.

20. An apparatus as in claim 6 wherein said shield is an annular member having a bottom and an annularly relieved inside bottom portion, and wherein said inside portion corresponds to said annularly relieved inside bottom portion and said mating portion corresponds to the bottom of said annular member.

21. An apparatus as in claim 20, wherein a peripheral upper surface region of said platen is depressed relative to an interior upper surface region of said platen.

22. An apparatus for supporting and protecting a semiconductor wafer during chemical vapor deposition, comprising the steps of:
means for restraining the wafer, a surface thereof being a deposition surface;
means for introducing a process gas into the process chamber through a dispersion head;
means for forming a cavity to enclose a peripheral edge of the wafer and a peripheral region of the wafer deposition surface, the cavity opening into the process chamber inside of the peripheral wafer deposition surface region;

means for introducing a second gas into the cavity for uniformly flowing the second gas therein; and means for maintaining the second gas in the cavity at a pressure greater than gas pressure in the process chamber.

23. An apparatus as in claim 22, wherein said second gas introducing means comprises:

means for uniformly introducing a backside gas to a peripheral region of a backside of the wafer; and means for directing the second gas through a cavity adapted to contain the wafer backside peripheral region, the wafer edge, and the wafer deposition surface peripheral region.

* * * * *

UNITED STATES PATENT AND TRADEMARK OFFICE
CERTIFICATE OF CORRECTION

PATENT NO. : 5,238,499
DATED : August 24, 1993
INVENTOR(S) : Everhardus P. van de Ven, et. al.

It is certified that error appears in the above-indentified patent and that said Letters Patent is hereby corrected as shown below:

On the Title page, item [56], under Foreign Patent Documents "353386A1" should read --3633386A1--.

Column 12, line 47, Claim 6, delete "f" insert --of--.

Signed and Sealed this

Twenty-second Day of November, 1994

Attest:

BRUCE LEHMAN

Attesting Officer

Commissioner of Patents and Trademarks